(12) United States Patent
Uejima (10) Patent No.: US 9,912,370 B2
(45) Date of Patent: Mar. 6, 2018

(54) HIGH-FREQUENCY MODULE AND COMMUNICATION DEVICE

(71) Applicant: Murata Manufacturing Co., Ltd., Nagaokakyo-shi, Kyoto-fu (JP)

(72) Inventor: Takanori Uejima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/071,227

(22) Filed: Mar. 16, 2016

(65) Prior Publication Data

US 2016/0197643 A1 Jul. 7, 2016

Related U.S. Application Data

(63) Continuation of application No. PCT/JP2014/074031, filed on Sep. 11, 2014.

(30) Foreign Application Priority Data

Sep. 17, 2013 (JP) ................. 2013-191793

(51) Int. Cl.
*H04B 1/00* (2006.01)
*H04B 1/40* (2015.01)
(Continued)

(52) U.S. Cl.
CPC .......... *H04B 1/40* (2013.01); *H01P 5/16* (2013.01); *H03H 7/465* (2013.01); *H03H 9/725* (2013.01);
(Continued)

(58) Field of Classification Search
CPC .......... H01P 5/16; H03H 7/465; H03H 9/725; H03H 9/72; H04B 1/006; H04B 1/525; H04B 1/40; H04B 1/0475; H04B 1/0053; H04B 1/0057; H04B 1/0067
See application file for complete search history.

(56) References Cited

U.S. PATENT DOCUMENTS 6,445,262 B1 9/2002 Tanaka et al.
2003/0092397 A1 5/2003 Uriu et al.
(Continued)

FOREIGN PATENT DOCUMENTS

CN 102204100 A 9/2011
JP 2000-82932 A 3/2000
(Continued)

OTHER PUBLICATIONS

Official Communication issued in corresponding International Application PCT/JP2014/074031, dated Dec. 9, 2014.

*Primary Examiner* — Ping Hsieh
(74) *Attorney, Agent, or Firm* — Keating & Bennett, LLP (57) ABSTRACT

In a high-frequency module, SAW duplexers are connected to a selection target terminal. A phase circuit is connected between a first SAW duplexer and the selection target terminal and a phase circuit is connected between a second SAW duplexer and the selection target terminal. The phase circuits make the second SAW duplexer side, when seen from the selection target terminal side, be in a substantially open state at a high frequency in the frequency bands of fundamental waves of first communication signals and make the first SAW duplexer side be in a substantially open state in the frequency bands of fundamental waves of second communication signals. The phase circuit is a band elimination filter having an attenuation pole near a third harmonic frequency band of the first transmission signal.

20 Claims, 6 Drawing Sheets

(51) Int. Cl.
*H01P 5/16* (2006.01)
*H03H 7/46* (2006.01)
*H04B 1/04* (2006.01)
*H04B 1/525* (2015.01)
*H03H 9/72* (2006.01)
*H04W 88/06* (2009.01)

(52) U.S. Cl.
CPC ........... *H04B 1/006* (2013.01); *H04B 1/0475* (2013.01); *H04B 1/525* (2013.01); *H03H 9/72* (2013.01); *H04W 88/06* (2013.01)

(56) References Cited

U.S. PATENT DOCUMENTS

| | | |
|---|---|---|
| 2005/0281210 A1 | 12/2005 | Makino |
| 2011/0260806 A1 | 10/2011 | Takeuchi |
| 2012/0224514 A1* | 9/2012 | Shibata ................ H04B 1/0057 370/277 |
| 2013/0035045 A1* | 2/2013 | Bremer ................ H04B 1/0057 455/77 |
| 2013/0316659 A1* | 11/2013 | Ylamurto ............. H04B 1/0057 455/73 |
| 2014/0133364 A1* | 5/2014 | Weissman ........... H04B 1/0057 370/273 |
| 2014/0300432 A1 | 10/2014 | Uejima et al. |

FOREIGN PATENT DOCUMENTS

| | | |
|---|---|---|
| JP | 2003-51758 A | 2/2003 |
| JP | 2004-260498 A | 9/2004 |
| JP | 2006-86871 A | 3/2006 |
| JP | 2010-45563 A | 2/2010 |
| JP | 2013-9411 A | 1/2013 |
| KR | 10-2003-0039319 A | 5/2003 |
| WO | 2013/099568 A1 | 7/2013 |

* cited by examiner

HIGH-FREQUENCY MODULE AND COMMUNICATION DEVICE

BACKGROUND OF THE INVENTION

1. Field of the Invention

The present invention relates to a high-frequency module that enables a plurality of communication signals having different frequency bands to be transmitted and received using a common antenna.

2. Description of the Related Art

Currently, a wireless communication device such as a cellular phone is required to be capable of transmitting and receiving communication signals of a plurality of types with diversification and multichannel of communication specifications. In this case, an antenna that is common to the plurality of types of communication signals is used for reducing the wireless communication device in size and so on.

When the common antenna is used, a first transmission/reception circuit transmitting and receiving a first communication signal and a second transmission/reception circuit transmitting and receiving a second communication signal are connected to the common antenna. That is to say, one end of the first transmission/reception circuit and one end of the second transmission/reception circuit are connected with a connection point to the common antenna interposed therebetween.

For example, a multiband duplexer module as disclosed in Japanese Unexamined Patent Application Publication No. 2010-45563 includes a common antenna terminal, a first duplexer (first transmission/reception circuit), and a second duplexer (second transmission/reception circuit). In the multiband duplexer module, one end of the first duplexer and one end of the second duplexer are connected and a connection point thereof is connected to the common antenna terminal.

In the high-frequency module (multiband duplexer module) as disclosed in Japanese Unexamined Patent Application Publication No. 2010-45563, an impedance matching circuit is connected between the first duplexer and the connection point of the first duplexer and the second duplexer. The impedance matching circuit performs impedance matching between the first duplexer and the common antenna terminal.

However, the high-frequency module as disclosed in Japanese Unexamined Patent Application Publication No. 2010-45563 causes the following problems.

Currently, a frequency band of a channel of each communication signal is required to be broadened in order to increase communication speed. A frequency bandwidth available for a single communication band is, however, limited. Accordingly, it has been proposed that the communication channel is substantially broadened by using a plurality of communication bands simultaneously. This method is called carrier aggregation (CA).

When the CA is applied to the above-mentioned high-frequency module, the high-frequency module transmits and receives a first communication signal using a first frequency band with the first duplexer and transmits and receives a second communication signal using a second frequency band with the second duplexer simultaneously. It should be noted that in this case, the high-frequency module transmits and receives both the first and second communication signals in some cases and the high-frequency module transmits and receives only one of the first and second communication signals in other cases.

In the configuration in which the first transmission/reception circuit and the second transmission/reception circuit are connected to the common antenna or the common terminal, when a harmonic frequency of a transmission signal (first transmission signal) of the first communication signal is close to a fundamental frequency of a reception signal (second reception signal) of the second communication signal or at least a part of the harmonic frequency of the transmission signal (first transmission signal) overlaps with the fundamental frequency of the reception signal (second reception signal), the harmonic signal of the first transmission signal leaks to the second duplexer. Due to this leakage, reception sensitivity to the second reception signal is deteriorated.

SUMMARY OF THE INVENTION

Preferred embodiments of the present invention provide a high-frequency module capable of suppressing leakage of a harmonic signal of a first transmission signal that is transmitted from a first transmission/reception circuit to a second transmission/reception circuit in the configuration in which the first transmission/reception circuit and the second transmission/reception circuit are connected to a common antenna or a common terminal.

A high-frequency module according to a preferred embodiment of the present invention includes a first transmission/reception circuit, a second transmission/reception circuit, a common terminal, and a phase circuit. The first transmission/reception circuit transmits and receives a first communication signal of a first frequency band and the second transmission/reception circuit transmits and receives a second communication signal of a second frequency band different from the first frequency band. The common terminal is a terminal to be connected to an antenna which is commonly used for the first communication signal and the second communication signal. A connection point is a single point at which the first transmission/reception circuit, the second transmission/reception circuit, and the common terminal are connected.

The phase circuit includes a circuit element which is connected to the connection point and the first transmission/reception circuit and performs phase adjustment so as to make the second transmission/reception circuit side, when seen from the connection point, be in an open state at a high frequency in the first frequency band and make the first transmission/reception circuit side, when seen from the connection point, be in an open state at a high frequency in the second frequency band. Further, the phase circuit includes a band elimination filter connected between the connection point and the first transmission/reception circuit, and the band elimination filter has an attenuation band including a harmonic frequency of a specific frequency band in the first frequency band and pass bands provided at a high frequency side and a low frequency side on outer side portions of the attenuation band, and includes the first frequency band in the pass band at the low frequency side.

With this configuration, the harmonic frequency component (harmonic signal) of a first transmission signal of the first communication signal that is output from the first transmission/reception circuit is cut by the band elimination filter and is not transmitted to the second transmission/reception circuit. In this case, a fundamental component of the first transmission signal is output to the common terminal with low loss and is not transmitted to the second transmission/reception circuit side. Further, a fundamental component of a second transmission signal is output to the common terminal with low loss and is not transmitted to the first transmission/reception circuit side.

Further, in a high-frequency module according to a preferred embodiment of the present invention, it is preferable that frequency bands of the attenuation and the second frequency band overlap with each other.

With this configuration, when the communication signal (second communication signal) of the second frequency band is transmitted or received, the harmonic frequency component (harmonic signal) of the first transmission signal does not leak to the second transmission/reception circuit side. Accordingly, when the reception signal (second reception signal) of the second communication signal is received, reception sensitivity to the second reception signal is improved.

In a high-frequency module according to a preferred embodiment of the present invention, it is preferable that the first transmission/reception circuit be a duplexer circuit which separates the transmission signal and the reception signal of the first communication signal, and the second transmission/reception circuit be a duplexer circuit which separates the transmission signal and the reception signal of the second communication signal.

With this configuration, specific circuit modes of the first and second transmission/reception circuits are indicated. In each of these duplexer circuits, although a SAW duplexer is used mainly, the SAW duplexer causes harmonic distortion and generates harmonic waves when a high-frequency signal such as a transmission signal having high signal electric power is input thereto. However, even when the harmonic signal is generated, routing of the harmonic signal generated from the first transmission/reception circuit (duplexer circuit) to the second transmission/reception circuit is prevented with the circuit configuration including the above-described phase circuit.

It is preferable that a high-frequency module according to a preferred embodiment of the present invention have the following configuration. That is, the phase circuit preferably includes a parallel resonance circuit including a first inductor which is connected in series between the connection point and the first transmission/reception circuit and a first capacitor which is connected in parallel with the first inductor.

With this configuration, the band elimination filter is defined by the inductor and the capacitor. This configuration is more preferable because insertion loss in the pass bands is low and no harmonic signal is generated from the band elimination filter itself.

In a high-frequency module according to a preferred embodiment of the present invention, it is preferable that the phase circuit include a second inductor which is connected between the parallel resonance circuit at the first transmission/reception circuit side and ground.

This configuration realizes a more optimum phase adjustment. Further, a surge which is input from the common terminal and is transmitted to the first transmission/reception circuit side is made to flow to the ground, thus protecting the first transmission/reception circuit from the surge.

In a high-frequency module according to a preferred embodiment of the present invention, it is preferable that the phase circuit further include a second capacitor which is connected in series between the connection point and the second transmission/reception circuit and a third inductor which is connected between the second capacitor at the second transmission/reception circuit side and the ground.

This configuration realizes a more optimum phase adjustment. Further, a surge which is input from the common terminal and is transmitted to the second transmission/reception circuit side is made to flow to the ground, thus protecting the second transmission/reception circuit from the surge.

It is preferable that a high-frequency module according to a preferred embodiment of the present invention have the following configuration. That is, the high-frequency module includes a multilayer body including a plurality of dielectric layers on which conductor patterns are provided. One of the second inductor and the third inductor is a coiled conductor defined by the conductor pattern in the multilayer body. The other one of the second inductor and the third inductor is a surface mount inductor component mounted on a surface of the multilayer body.

It is preferable that a high-frequency module according to a preferred embodiment of the present invention have the following configuration. That is, the multilayer body includes a plurality of ground conductors therein. A ground conductor to which the second inductor is connected is different from a ground conductor to which the third inductor is connected.

With these configurations, the level of isolation between a high-frequency transmission line between the common terminal and the first transmission/reception circuit and a high-frequency transmission line between the common terminal and the second transmission/reception circuit is able to be made high.

A high-frequency module according to a preferred embodiment of the present invention may have the following configuration. That is, the high-frequency module includes a multilayer body including a plurality of dielectric layers on which conductor patterns are provided. The second inductor and the third inductor are coiled conductors defined by the conductor patterns in the multilayer body. A first circuit element of the first transmission/reception circuit and a second circuit element of the second transmission/reception circuit are mounted on a surface of the multilayer body. The coiled conductor of the second inductor is arranged under a mounting region of the first circuit element and the coiled conductor of the third inductor is arranged under a mounting region of the second circuit element.

With this configuration, even when the second inductor and the third inductor are provided in the multilayer body, the second inductor and the third inductor are spaced from each other. With this, the level of isolation between the high-frequency transmission line between the common terminal and the first transmission/reception circuit and the high-frequency transmission line between the common terminal and the second transmission/reception circuit are able to be made high.

In a high-frequency module according to a preferred embodiment of the present invention, it is preferable that the first circuit element and the second circuit element include duplexers using piezoelectric resonators.

With this configuration, the piezoelectric resonators causing harmonic distortion are included in the first and second transmission/reception circuits. In this case, even when a harmonic signal of the first transmission signal is generated due to the harmonic distortion of the piezoelectric resonator, the harmonic signal is cut by the band elimination filter and is not transmitted to the second transmission/reception circuit.

A high-frequency module according to a preferred embodiment of the present invention may have the following configuration. That is, the high-frequency module further includes a switch circuit which includes an antenna connection terminal and a plurality of selection target terminals, and selects one of the plurality of selection target terminals and connects the selected selection target terminal to the antenna connection terminal. The common terminal is one of the plurality of selection target terminals of the switch circuit.

With this configuration, an increased number of various types of communication signals are able to be transmitted and received by the common antenna while obtaining the above-described action effects between two specific types of communication signals.

A high-frequency module according to a preferred embodiment of the present invention may have the following configuration. That is, the high-frequency module further includes a switch circuit which includes an antenna connection terminal and a plurality of selection target terminals, and selects one of the plurality of selection target terminals and connects the selected selection target terminal to the antenna connection terminal. The switch circuit includes a diode-type switch element which is mounted on the surface of the multilayer body.

With this configuration, a specific mode of the switch circuit is indicated. Input of surge noise generated from the switch circuit to the first transmission/reception circuit and the second transmission/reception circuit is significantly reduced or prevented by including the above-described inductor (shunt inductor) which is connected to the ground. Further, static electricity charged on off-terminals (selection target terminals which are not connected to the antenna connection terminal) of the switch circuit are able to be made to flow to the ground. This increases the switch speed of the switch circuit.

In a high-frequency module according to a preferred embodiment of the present invention, it is preferable that the first communication signal and the second communication signal be transmitted/received by any one of simultaneous transmission in which the two communication signals are transmitted simultaneously, simultaneous reception in which the two communication signals are received simultaneously, and simultaneous transmission and reception in which one of the communication signals is transmitted and the other of the communication signals is received simultaneously.

With this configuration, the above-described high-frequency module is preferably used for the carrier aggregation in which the communication signals of two types are communicated simultaneously. In this case, when the communication signals of two types for the carrier aggregation are set in the first communication signal and the second communication signal and transmission of the first transmission signal and reception of the second reception signal are performed simultaneously, input of the harmonic signal of the first communication signal to the second transmission/reception circuit is significantly reduced or prevented, thus improving a signal-to-noise (SN) ratio of the second reception signal.

Further, a communication device according to another preferred embodiment of the present invention has the following configuration. That is, the communication device includes the high-frequency module according to any one of the above-described configurations of various preferred embodiments of the present invention, a common antenna, and a radio frequency integrated circuit (RFIC). The common antenna is an antenna that is connected to the high-frequency module and is common to the first communication signal and the second communication signal. The RFIC is connected to the high-frequency module and controls transmission/reception of the first communication signal and the second communication signal while selecting any one of simultaneous transmission in which the two communication signals are transmitted simultaneously, simultaneous reception in which the two communication signals are received simultaneously, and simultaneous transmission and reception in which one of the communication signals is transmitted and the other of the communication signals is received simultaneously.

With this configuration, the communication device using the above-described high-frequency module for the carrier aggregation in which the communication signals of two types are communicated simultaneously is described. In this case, when the communication signals of two types for the carrier aggregation are set in the first communication signal and the second communication signal and transmission of the first transmission signal and reception of the second reception signal are performed simultaneously, input of the harmonic signal of the first communication signal to the second transmission/reception circuit is prevented, thus improving the SN ratio of the second reception signal.

According to various preferred embodiments of the present invention, leakage of the harmonic signal of the first transmission signal that is transmitted from the first transmission/reception circuit to the second transmission/reception circuit is significantly reduced or prevented in the configuration in which the first transmission/reception circuit and the second transmission/reception circuit are connected to the common antenna or the common terminal. This significantly reduced or prevents deterioration in reception sensitivity of the second transmission/reception circuit.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
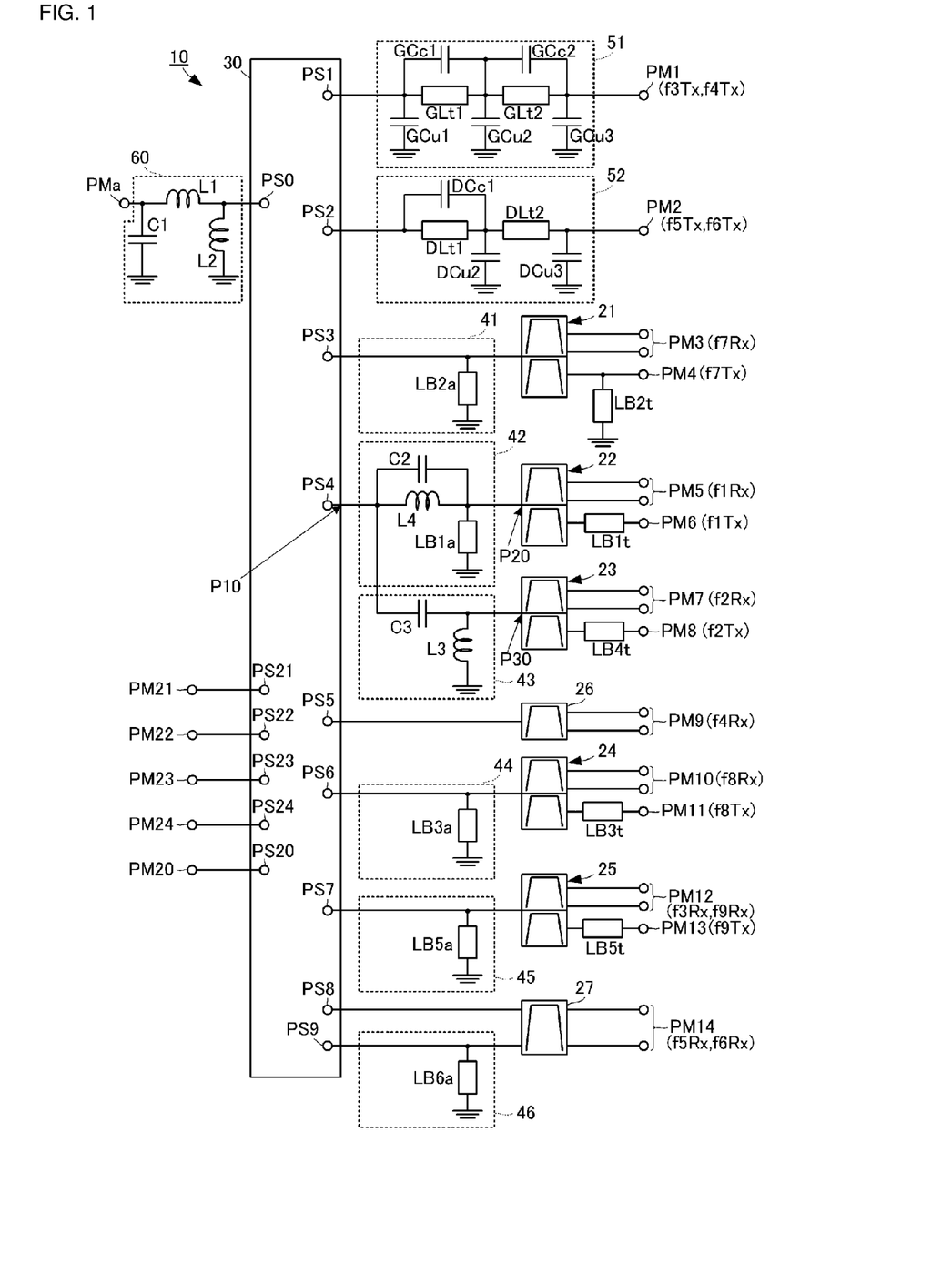
FIG. 1 is a circuit diagram of a high-frequency module according to a first preferred embodiment of the present invention.

A high-frequency module according to a first preferred embodiment of the present invention will be described with reference to the drawings. FIG. 1 is a circuit diagram of the high-frequency module in the first preferred embodiment of the present invention.

A high-frequency module 10 includes an antenna connection terminal PMa, front-end connection terminals PM1, PM2, PM3, PM4, PM5, PM6, PM7, PM8, PM9, PM10, PM11, PM12, PM13, and PM14, and control terminals PM20, PM21, PM22, PM23, and PM24. The high-frequency module 10 includes a plurality of SAW duplexers 21, 22, 23, 24, and 25, SAW filters 26 and 27, a switch IC 30, phase circuits 41, 42, 43, 44, 45, and 46, filter circuits 51 and 52, and an antenna matching circuit 60.

The switch IC 30 includes a common terminal PS0, a plurality of selection target terminals PS1, PS2, PS3, PS4, PS5, PS6, PS7, PS8, and PS9, and control signal input terminals PS20, PS21, PS22, PS23, and PS24.

The control signal input terminal PS20 is connected to the control terminal PM20 of the high-frequency module 10, and a switch driving voltage is input to the control signal input terminal PS20 from the outside. The control signal input terminals PS21 to PS24 are connected to the control terminals PM21 to PM24 of the high-frequency module 10, respectively, and individual switch control signals are input to them.

The switch IC 30 is driven with the driving voltage which is input to the control signal input terminal PS20. The switch IC 30 is a semiconductor switch including a plurality of diode switches. The switch IC 30 controls ON and OFF of the diode switches in accordance with combinations of ON and OFF states of the control signals which are input to the control signal input terminals PS21 to PS24, selects one terminal among the plurality of selection target terminals PS1 to PS9, and connects the selected terminal to the common terminal PS0.

The common terminal PS0 of the switch IC 30 is connected to the antenna connection terminal PMa of the high-frequency module 10 with the antenna matching circuit 60 interposed therebetween. The antenna matching circuit 60 includes inductors L1 and L2 and a capacitor C1. The inductor L1 is connected in series between the common terminal PS0 and the antenna connection terminal PMa. The inductor L2 is connected between an end portion of the inductor L1 at the common terminal PS0 side and the ground. The capacitor C1 is connected between an end portion of the inductor L1 at the antenna connection terminal PMa side and the ground.

The antenna matching circuit 60 performs impedance matching between the common terminal PS0 of the switch IC 30 and an antenna (not illustrated) which is connected to the antenna connection terminal PMa with the above circuit configuration. The antenna matching circuit 60 causes a surge which is input from the antenna connection terminal PMa to flow to the ground by including the inductor L2. This prevents application of the surge to the switch IC 30 side relative to a connection point of the inductor L2 to a transmission line. Thus, the antenna matching circuit 60 also functions as an electro-static-discharge (ESD) protection circuit.

The selection target terminal PS1 of the switch IC 30 is connected to the front-end connection terminal PM1 of the high-frequency module 10 with the filter circuit 51 interposed therebetween. The filter circuit 51 includes inductors GLt1 and GLt2 and capacitors GCc1, GCc2, GCu1, GCu2, and GCu3. The inductors GLt1 and GLt2 are connected in series between the selection target terminal PS1 and the front-end connection terminal PM1. The capacitor GCc1 is connected in parallel with the inductor GLt1 and the capacitor GCc2 is connected in parallel with the inductor GLt2. The capacitor GCu1 is connected between an end portion of the inductor GLt1 at the selection target terminal PS1 side and the ground. The capacitor GCu2 is connected between a connection point of the inductors GLt1 and GLt2 and the ground. The capacitor GCu3 is connected between an end portion of the inductor GLt2 at the front-end connection terminal PM1 side and the ground.

The filter circuit 51 defines and functions as a low pass filter with the above circuit configuration. To be specific, the filter circuit 51 attenuates harmonic signals of transmission signals (f3Tx and f4Tx) which are input from the front-end connection terminal PM1 and transmits fundamental signals of the transmission signals (f3Tx and f4Tx) to the selection target terminal PS1. The transmission signals (f3Tx and f4Tx) are a transmission signal of a communication signal of GSM 850 and a transmission signal of a communication signal of GSM 900, for example.

The selection target terminal PS2 of the switch IC 30 is connected to the front-end connection terminal PM2 of the high-frequency module 10 with the filter circuit 52 interposed therebetween. The filter circuit 52 includes inductors DLt1 and DLt2 and capacitors DCc1, DCu2, and DCu3. The inductors DLt1 and DLt2 are connected in series between the selection target terminal PS2 and the front-end connection terminal PM2. The capacitor DCc1 is connected in parallel with the inductor DLt1. The capacitor DCu2 is connected between the inductors DLt1, DLt2 and the ground. The capacitor DCu3 is connected between an end portion of the inductor DLt2 at the front-end connection terminal PM2 side and the ground.

The filter circuit 52 defines and functions as a low pass filter with the above circuit configuration. To be specific, the filter circuit 52 attenuates harmonic signals of transmission signals (f5Tx and f6Tx) which are input from the front-end connection terminal PM2 and transmits fundamental signals of the transmission signals (f5Tx and f6Tx) to the selection target terminal PS2. The transmission signals (f5Tx and f6Tx) preferably include a transmission signal of a communication signal of GSM 1800 and a transmission signal of a communication signal of GSM 1900, for example.

The selection target terminal PS3 of the switch IC 30 is connected to the front-end connection terminals PM3 and PM4 of the high-frequency module 10 with the phase circuit 41 and the SAW duplexer 21 interposed therebetween. To be more specific, the selection target terminal PS3 is connected to a common terminal of the SAW duplexer 21 with the phase circuit 41 interposed therebetween. The SAW duplexer 21 includes a first SAW filter and a second SAW filter including piezoelectric resonators. The common terminal of the SAW duplexer 21 is connected to the balanced front-end connection terminal PM3 with the first SAW filter interposed therebetween. The common terminal of the SAW duplexer 21 is connected to the front-end connection terminal PM4 with the second SAW filter interposed therebetween. An end portion of the second SAW filter of the SAW duplexer 21 at the front-end connection terminal PM4 side is connected to the ground with an inductor LB2t interposed therebetween. The first SAW filter of the SAW duplexer 21 transmits a fundamental signal of a reception signal (f7Rx) which is output to the front-end connection terminal PM3 from the switch IC 30 side and attenuates frequency signals other than the fundamental signal of the reception signal (f7Rx). The second SAW filter of the SAW duplexer 21 transmits a fundamental signal of a transmission signal (f7Tx) which is input from the front-end connection terminal PM4 and attenuates frequency signals having a frequency different from the fundamental signal of the transmission signal (f7Tx). The communication signals (f7Tx and f7Rx) preferably include a transmission signal and a reception signal of a communication signal of LTE Band 2, for example.

The phase circuit 41 includes an inductor LB2a. The inductor LB2a is connected between a specific position of a transmission line connecting the selection target terminal PS3 and the SAW duplexer 21 and the ground. The phase circuit 41 performs impedance matching at the fundamental frequencies of the communication signals (f7Tx and f7Rx) between the selection target terminal PS3 and the SAW duplexer 21. Further, phase adjustment in which an induction property is provided to the common terminal of the SAW duplexer 21 normally having a capacitive property is able to be performed easily by including the inductor LB2a. That is to say, the above-described impedance matching is easily performed.

Moreover, the phase circuit 41 causes a surge from the switch IC 30 side to flow to the ground by including the inductor LB2a. To be specific, the surge from the switch IC 30 side includes a surge which is input from the above-described antenna connection terminal PMa and a surge generated by a switching operation of the switch IC 30. With this, ESD protection for the SAW duplexer 21 that is generally weaker to static electricity than the switch IC 30 is realized.

The selection target terminal PS4 of the switch IC 30 is connected to the front-end connection terminals PM5 and PM6 of the high-frequency module 10 with the phase circuit 42 and the SAW duplexer 22 interposed therebetween. Further, the selection target terminal PS4 of the switch IC 30 is connected to the front-end connection terminals PM7 and PM8 of the high-frequency module 10 with the phase circuit 43 and the SAW duplexer 23 interposed therebetween.

The phase circuits 42 and 43 correspond to a "phase circuit". The circuit at the side of the front-end connection terminals PM5 and PM6 relative to the SAW duplexer 22, which includes the SAW duplexer 22, corresponds to a "first transmission/reception circuit". The circuit at the side of the front-end connection terminals PM7 and PM8 relative to the SAW duplexer 23, which includes the SAW duplexer 23, corresponds to a "second transmission/reception circuit". Circuits which are connected to the selection target terminal PS4 of the switch IC 30 are minimal constituent elements of the high-frequency module according to a preferred embodiment of the present invention and detailed configuration and characteristics thereof will be described later.

The selection target terminal PS5 of the switch IC 30 is connected to the front-end connection terminal PM9 of the high-frequency module 10 with the SAW filter 26 interposed therebetween. The front-end connection terminal PM9 is a balanced terminal. The SAW filter 26 transmits a fundamental signal of a reception signal (f4Rx) which is output to the front-end connection terminal PM9 from the switch IC 30 side and attenuates frequency signals other than the fundamental signal of the reception signal (f4Rx). The reception signal (f4Rx) is a reception signal of a communication signal of GSM 900, for example.

The selection target terminal PS6 of the switch IC 30 is connected to the front-end connection terminals PM10 and PM11 of the high-frequency module 10 with the phase circuit 44 and the SAW duplexer 24 interposed therebetween. To be more specific, the selection target terminal PS6 is connected to a common terminal of the SAW duplexer 24 with the phase circuit 44 interposed therebetween. The SAW duplexer 24 includes a first SAW filter and a second SAW filter including piezoelectric resonators. The common terminal of the SAW duplexer 24 is connected to the balanced front-end connection terminal PM10 with the first SAW filter interposed therebetween. The common terminal of the SAW duplexer 24 is connected to the front-end connection terminal PM11 with the second SAW filter interposed therebetween. An end portion of the second SAW filter of the SAW duplexer 24 at the front-end connection terminal PM11 side is connected to the front-end connection terminal PM11 with an inductor LB3t interposed therebetween. The first SAW filter of the SAW duplexer 24 transmits a fundamental signal of a reception signal (f8Rx) which is output to the front-end connection terminal PM10 from the switch IC 30 side and attenuates frequency signals other than the fundamental signal of the reception signal (f8Rx). The second SAW filter of the SAW duplexer 24 transmits a fundamental signal of a transmission signal (f8Tx) which is input from the front-end connection terminal PM11 and attenuates frequency signals having a frequency different from the fundamental signal of the transmission signal (f8Tx). The communication signals (f8Tx and f8Rx) preferably include a transmission signal and a reception signal of a communication signal of LTE Band 1, for example.

The phase circuit 44 includes an inductor LB3a. The inductor LB3a is connected between a specific position of a transmission line connecting the selection target terminal PS6 and the SAW duplexer 24 and the ground. The phase circuit 44 performs impedance matching at the fundamental frequencies of the communication signals (f8Tx and f8Rx) between the selection target terminal PS6 and the SAW duplexer 24. Further, phase adjustment in which an induction property is provided to the common terminal of the SAW duplexer 24 normally having a capacitive property is able to be performed easily by including the inductor LB3a. That is to say, the above-described impedance matching is easily performed.

Moreover, the phase circuit 44 causes a surge from the switch IC 30 side to flow to the ground by including the inductor LB3a. To be specific, the surge from the switch IC 30 side includes a surge which is input from the above-described antenna connection terminal PMa and a surge generated by a switching operation of the switch IC 30. With this, ESD protection for the SAW duplexer 24 that is generally weaker to static electricity than the switch IC 30 is realized.

The selection target terminal PS7 of the switch IC 30 is connected to the front-end connection terminals PM12 and PM13 of the high-frequency module 10 with the phase circuit 45 and the SAW duplexer 25 interposed therebetween. To be more specific, the selection target terminal PS7 is connected to a common terminal of the SAW duplexer 25 with the phase circuit 45 interposed therebetween. The SAW duplexer 25 includes a first SAW filter and a second SAW filter including piezoelectric resonators. The common terminal of the SAW duplexer 25 is connected to the balanced front-end connection terminal PM12 with the first SAW filter interposed therebetween. The common terminal of the SAW duplexer 25 is connected to the front-end connection terminal PM13 with the second SAW filter interposed therebetween. An end portion of the second SAW filter of the SAW duplexer 25 at the front-end connection terminal PM13 side is connected to the front-end connection terminal PM13 with an inductor LB5t interposed therebetween. The first SAW filter of the SAW duplexer 25 transmits fundamental signals of reception signals (f3Rx and f9Rx) which are output to the front-end connection terminal PM12 from the switch IC 30 side and attenuates frequency signals other than the fundamental signals of the reception signals (f3Rx and f9Rx). The second SAW filter of the SAW duplexer 25 transmits a fundamental signal of a transmission signal (f9Tx) which is input from the front-end connection terminal PM13 and attenuates frequency signals having a frequency different from the fundamental signal of the transmission signal (f9Tx). The communication signals (f9Tx and f9Rx) preferably include a transmission signal and a reception signal of a communication signal of LTE Band 5, for example. The reception signal (f3Rx) is a reception signal of a communication signal of GSM 1800, for example.

The phase circuit 45 includes an inductor LB5a. The inductor LB5a is connected between a specific position of a transmission line connecting the selection target terminal PS7 and the SAW duplexer 25 and the ground. The phase circuit 45 performs impedance matching at the fundamental frequencies of the communication signals (f9Tx, f9Rx, and f3Rx) between the selection target terminal PS7 and the SAW duplexer 25. Further, phase adjustment in which an induction property is provided to the common terminal of the SAW duplexer 25 normally having a capacitive property is able to be performed easily by including the inductor LB5a. That is to say, the above-described impedance matching is easily performed.

Moreover, the phase circuit 45 causes a surge from the switch IC 30 side to flow to the ground by including the inductor LB5a. To be specific, the surge from the switch IC 30 side includes a surge which is input from the above-described antenna connection terminal PMa and a surge generated by a switching operation of the switch IC 30. With this, ESD protection for the SAW duplexer 25 that is generally weaker to static electricity than the switch IC 30 is realized.

The selection target terminal PS8 of the switch IC 30 is connected to the front-end connection terminal PM14 of the high-frequency module 10 with the SAW filter 27 interposed therebetween. The selection target terminal PS9 of the switch IC 30 is connected to the front-end connection terminal PM14 of the high-frequency module 10 with the phase circuit 46 and the SAW filter 27 interposed therebetween. The front-end connection terminal PM14 is a balanced terminal. The SAW filter 27 transmits fundamental signals of reception signals (f5Rx and f6Rx) which are output to the front-end connection terminal PM14 from the switch IC 30 side and attenuates frequency signals other than the fundamental signals of the reception signals (f5Rx and f6Rx). The reception signals (f5Rx and f6Rx) are reception signals of a communication signal of GSM 1800 and a communication signal of GSM 1900, for example.

The phase circuit 46 includes an inductor LB6a. The inductor LB6a is connected between a specific position of a transmission line connecting the selection target terminal PS9 and the SAW filter 27 and the ground. Phase adjustment in which an induction property is provided to the SAW filter 27 normally having a capacitive property is able to be performed easily by including the inductor LB6a. That is to say, the above-described impedance matching is easily performed.

Further, the phase circuit 46 performs impedance matching at the fundamental frequency of the reception signal (f6Rx) between the selection target terminal PS9 and the SAW filter 27. Moreover, the phase circuit 46 causes a surge from the switch IC 30 side to flow to the ground by including the inductor LB6a. To be specific, the surge from the switch IC 30 side includes a surge which is input from the above-described antenna connection terminal PMa and a surge generated by a switching operation of the switch IC 30. With this, ESD protection for the SAW filter 27 that is generally weaker to static electricity than the switch IC 30 is realized.

Next, a specific configuration of the circuits that are connected to the selection target terminal PS4 of the switch IC 30 is described. It should be noted that the selection target terminal PS4 corresponds to a "common terminal".

As described above, the selection target terminal PS4 of the switch IC 30 is connected to the front-end connection terminals PM5 and PM6 of the high-frequency module 10 with the phase circuit 42 and the SAW duplexer 22 interposed therebetween.

To be more specific, the selection target terminal PS4 is connected to the common terminal which is electrically connected to the first transmission/reception circuit with the phase circuit interposed therebetween. The first transmission/reception circuit defines a duplexer circuit including the SAW duplexer 22.

The SAW duplexer 22 includes a first SAW filter and a second SAW filter including piezoelectric resonators. The common terminal of the SAW duplexer 22 is connected to the balanced front-end connection terminal PM5 with the first SAW filter interposed therebetween. The common terminal of the SAW duplexer 22 is connected to the front-end connection terminal PM6 with the second SAW filter interposed therebetween.

An end portion of the second SAW filter of the SAW duplexer 22 at the front-end connection terminal PM6 side is connected to the front-end connection terminal PM6 with an inductor LB1t interposed therebetween.

The first SAW filter of the SAW duplexer 22 transmits a fundamental signal of a reception signal (f1Rx) which is output to the front-end connection terminal PM5 from the switch IC 30 side and attenuates frequency signals other than the fundamental signal of the reception signal (f1Rx).

The second SAW filter of the SAW duplexer 22 transmits a fundamental signal of a transmission signal (f1Tx) which is input from the front-end connection terminal PM6 and attenuates frequency signals having a frequency different from the fundamental signal of the transmission signal (f1Tx). The communication signals (f1Tx and f1Rx) are a transmission signal and a reception signal of a communication signal of LTE Band 17, for example. The communication signal corresponds to a "first communication signal".

The selection target terminal PS4 of the switch IC 30 is connected to the front-end connection terminals PM7 and PM8 of the high-frequency module 10 with the phase circuit 43 and the SAW duplexer 23 interposed therebetween.

To be more specific, the selection target terminal PS4 is connected to the common terminal which is electrically connected to the second transmission/reception circuit with the phase circuit 43 interposed therebetween. The second transmission/reception circuit defines a duplexer circuit including the SAW duplexer 23.

The SAW duplexer 23 includes a first SAW filter and a second SAW filter including piezoelectric resonators. The common terminal of the SAW duplexer 23 is connected to the balanced front-end connection terminal PM7 with the first SAW filter interposed therebetween. The common terminal of the SAW duplexer 23 is connected to the front-end connection terminal PM8 with the second SAW filter interposed therebetween.

An end portion of the second SAW filter of the SAW duplexer 23 at the front-end connection terminal PM8 side is connected to the front-end connection terminal PM8 with an inductor LB4t interposed therebetween.

The first SAW filter of the SAW duplexer 23 transmits a fundamental signal of a reception signal (f2Rx) which is output to the front-end connection terminal PM7 from the switch IC 30 side and attenuates frequency signals other than the fundamental signal of the reception signal (f2Rx).

The second SAW filter of the SAW duplexer 23 transmits a fundamental signal of a transmission signal (f2Tx) which is input from the front-end connection terminal PM8 and attenuates frequency signals having a frequency different from the fundamental signal of the transmission signal (f2Tx). The communication signals (f2Tx and f2Rx) are a transmission signal and a reception signal of a communication signal of LTE Band 4, for example. The communication signal corresponds to a "second communication signal".

The phase circuit 42 includes inductors L4 and LB1a and a capacitor C2. The inductor L4 is connected in series between the selection target terminal PS4 and the SAW duplexer 22. The capacitor C2 is connected in parallel with the inductor L4. The inductor LB1a is connected between an end portion of the inductor L4 at the SAW duplexer 22 side and the ground.

The phase circuit 43 includes a capacitor C3 and an inductor L3. The capacitor C3 is connected in series between the selection target terminal PS4 and the SAW duplexer 23. The inductor L3 is connected between an end portion of the capacitor C3 at the SAW duplexer 23 side and the ground.

The phase circuit 42 performs impedance matching in frequency bands of the fundamental waves of the communication signals (f1Tx and f1Rx) between the selection target terminal PS4 and the SAW duplexer 22. The phase circuit 43 performs impedance matching in frequency bands of the fundamental waves of the communication signals (f2Tx and f2Rx) between the selection target terminal PS4 and the SAW duplexer 23.

With this configuration, the fundamental signal of the first communication signal (the first transmission signal and the first reception signal) is able to be transmitted with low loss between the selection target terminal PS4 and the SAW duplexer 22. Further, the fundamental signal of the second communication signal (the second transmission signal and the second reception signal) is able to be transmitted with low loss between the selection target terminal PS4 and the SAW duplexer 23.

In addition, the phase circuits 42 and 43 are set so as to make the SAW duplexer 23 side, when seen from a connection point of the phase circuits 42 and 43 which are connected to the selection target terminal PS4, be in a substantially open state at a high frequency in the frequency bands of the fundamental waves of the communication signals (f1Tx and f1Rx). Further, the phase circuits 42 and 43 are set so as to make the SAW duplexer 22 side, when seen from the connection point of the phase circuits 42 and 43 which are connected to the selection target terminal PS4, be in a substantially open state in the frequency bands of the fundamental waves of the communication signals (f2Tx and f2Rx).

With this configuration, the level of isolation in the frequency bands of the fundamental signal of the first communication signal and the fundamental signal of the second communication signal is able to be ensured to be high between the SAW duplexers 22 and 23 which are connected to the common selection target terminal PS4.

In addition, the phase circuit 42 includes an LC parallel resonance circuit including the inductor L4 and the capacitor C2. With this, the phase circuit 42 also includes a band elimination filter in which a resonant frequency of the LC parallel resonance circuit is set to an attenuation pole frequency.

In this case, the resonant frequency of the LC parallel resonance circuit is set so as to match or to be close to the frequency band of the harmonic signal of the first communication signal.

For example, when the first communication signal is in Band 17 and the second communication signal is in Band 4, the resonant frequency of the LC parallel resonance circuit is set so as to match or to be close to a frequency band of a third harmonic signal of the first communication signal. The transmission frequency band of Band 17 is 704 MHz to 716 MHz and the reception frequency band of Band 4 is 2110 MHz to 2155 MHz. Therefore, the frequency band of the third harmonic waves of the transmission signal f1Tx (first transmission signal) of Band 17 overlaps with the frequency band of the fundamental waves of the reception signal f2Rx (second reception signal) of Band 4.

However, as described above, the resonant frequency of the LC parallel resonance circuit including the phase circuit 42 is set so as to match or to be close to the frequency band of the third harmonic signal of the first communication signal. With this structure, the phase circuit 42 largely attenuates the frequency band of the third harmonic signal of the first communication signal so as to suppress the transmission of the signal of the frequency band of the third harmonic signal of the first transmission signal f1Tx, that is, the signal of the frequency band of the fundamental waves of the second reception signal f2Rx to the selection target terminal PS4 side and the SAW duplexer 23 side from the SAW duplexer 22 side.

Thus, the unique structure of the present preferred embodiment ensures the high level of isolation in the frequency band of the harmonic signal of the first transmission signal between the SAW duplexers 22 and 23, which are connected to the common selection target terminal PS4.

In particular, even when carrier aggregation in which transmission of the first transmission signal f1Tx and reception of the second reception signal f2Rx are performed simultaneously is executed, leakage of the third harmonic signal of the first transmission signal f1Tx to the SAW duplexer 23 side is suppressed and a decrease in the reception sensitivity to the second reception signal f2Rx that is being received at this time is suppressed, while the first transmission signal f1Tx is transmitted to the selection target terminal PS4 from the SAW duplexer 22 with low loss. In other words, the reception SN ratio of the second reception signal f2Rx is greatly improved.

Figure 2A:
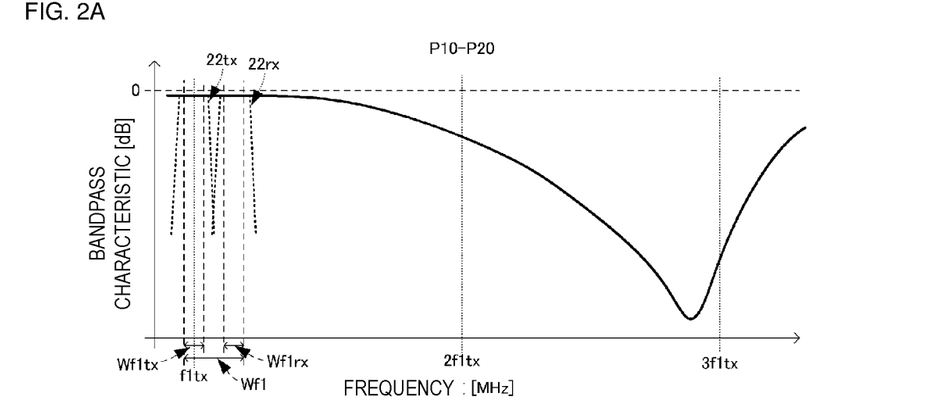
FIGS. 2A-2C include graphs illustrating various transmission characteristics of the high-frequency module in the first preferred embodiment of the present invention.
Figure 2B:
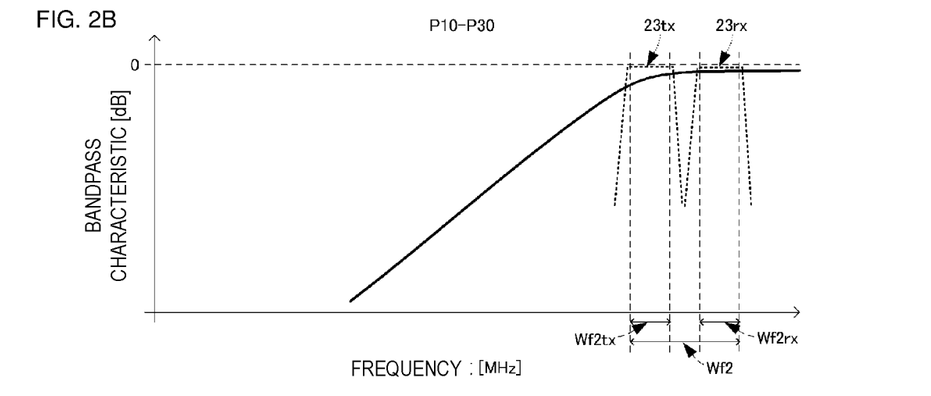
Figure 2C:
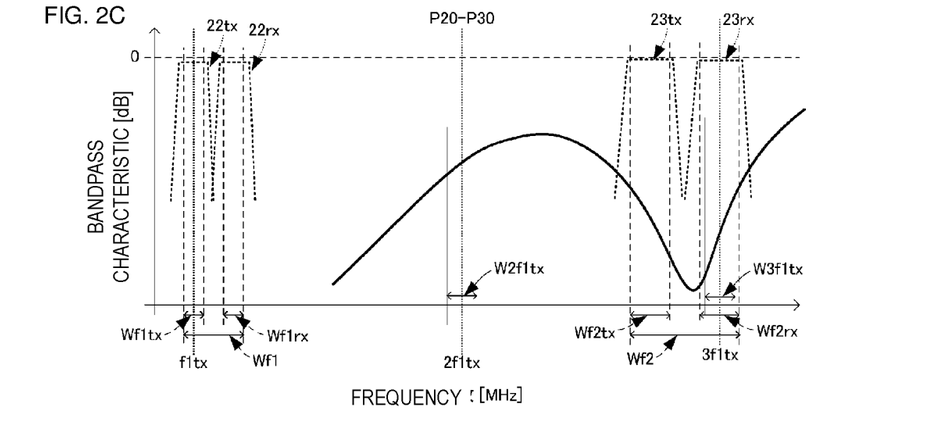

FIGS. 2A-2C include graphs illustrating various transmission characteristics of the high-frequency module in the first preferred embodiment of the present invention. FIG. 2A is a graph illustrating bandpass characteristics of a portion (P10-P20) between the selection target terminal PS4 (P10) and the common terminal (P20) of the SAW duplexer 22. FIG. 2B is a graph illustrating bandpass characteristics of a portion (P10-P30) between the selection target terminal PS4 (P10) and the common terminal (P30) of the SAW duplexer 23. FIG. 2C is a graph illustrating bandpass characteristics of a portion (P20-P30) between the common terminal (P20) of the SAW duplexer 22 and the common terminal (P30) of the SAW duplexer 23. In FIGS. 2A-2C, 22tx indicates the bandpass characteristic of the second SAW filter of the SAW duplexer 22 and 22rx indicates the bandpass characteristic of the first SAW filter of the SAW duplexer 22. 23tx indicates the bandpass characteristic of the second SAW filter of the SAW duplexer 23 and 23rx indicates the bandpass characteristic of the first SAW filter of the SAW duplexer 23.

As illustrated in FIG. 2A, transmission with low loss between the selection target terminal PS4 and the SAW duplexer 22 can be performed in the frequency band Wf1tx of the first transmission signal f1tx and the frequency band Wf1Rx of the first reception signal f1rx, that is, in the fundamental frequency band Wf1 of the first communication signal. On the other hand, attenuation is able to be obtained in the second harmonic signal 2f1tx and the third harmonic signal 3f1tx of the first transmission signal f1tx. In particular, large attenuation is able to be obtained in the third harmonic signal 3f1tx.

As illustrated in FIG. 2B, transmission with low loss between the selection target terminal PS4 and the SAW duplexer 23 is able to be performed in the frequency band Wf1Tx of the second transmission signal f2Tx and the frequency band Wf2Rx of the second reception signal f2Rx, that is, in the fundamental frequency band Wf2 of the second communication signal. On the other hand, attenuation is able to be obtained in the frequency band lower than the fundamental frequency band Wf2 of the second communication signal. In particular, large attenuation is able to be obtained in the fundamental frequency band Wf1 of the first communication signal.

As illustrated in FIG. 2C, large attenuation is able to be obtained in both of the fundamental frequency band Wf1 of the first communication signal and the fundamental frequency band Wf2 of the second communication signal, between the SAW duplexer 22 and the SAW duplexer 23. That is to say, a high level of isolation is able to be ensured in both of the fundamental frequency band Wf1 of the first communication signal and the fundamental frequency band Wf2 of the second communication signal, between the SAW duplexer 22 and the SAW duplexer 23.

With the circuit configuration in the present preferred embodiment as described above, the first communication signal is able to be transmitted with low loss between the selection target terminal PS4 and the SAW duplexer 22, the second communication signal is able to be transmitted with low loss between the selection target terminal PS4 and the SAW duplexer 23, and a high level of isolation is able to be ensured in the frequency bands of the fundamental signal of the first communication signal and the fundamental signal of the second communication signal and in the frequency bands of the harmonic signals of the fundamental signal of the first transmission signal and the fundamental signal of the second communication signal in which the frequency bands thereof overlap with each other, between the SAW duplexers 22 and 23.

In addition, the phase circuit 42 further significantly improve or optimize the impedance matching for the first communication signal by including the inductor LB1a and easily perform phase adjustment in which an induction property is provided to the common terminal of the SAW duplexer 22 normally having a capacitive property. That is to say, the above-described impedance matching is easily performed.

Further, the phase circuit 42 causes a surge from the switch IC 30 side to flow to the ground by including the inductor LB1a. To be specific, the surge from the switch IC 30 side includes a surge which is input from the above-described antenna connection terminal PMa and a surge generated by a switching operation of the switch IC 30. With this, ESD protection for the SAW duplexer 22 that is generally weaker to static electricity than the switch IC 30 is realized.

Further, the phase circuit 43 further significantly improves or optimizes the impedance matching for the second communication signal by including the inductor L3 and easily performs phase adjustment in which an induction property is provided to the common terminal of the SAW duplexer 23 normally having a capacitive property. That is to say, the above-described impedance matching is easily performed.

Moreover, the phase circuit 43 causes a surge from the switch IC 30 side to flow to the ground by including the inductor L3. To be specific, the surge from the switch IC 30 side includes a surge which is input from the above-described antenna connection terminal PMa and a surge generated by a switching operation of the switch IC 30. With this, ESD protection for the SAW duplexer 23 that is generally weaker to static electricity than the switch IC 30 is realized.

It should be noted that the above-mentioned band elimination filter can be realized with a circuit other than the LC parallel resonance circuit. However, it is more preferable for the band elimination filter to include the LC parallel resonance circuit, because transmission with low loss in the bands other than the attenuation bands can be performed without causing the harmonic distortion. In particular, when the attenuation pole frequency is set to the frequency of the third harmonic signal as described above, the difference in the frequency between the frequency band of the fundamental signal and the attenuation pole frequency is large and sufficiently practical transmission characteristics are able to be realized even if a single stage LC parallel resonance circuit having a relatively moderate attenuation characteristic is used. Thus, usage of the single stage LC parallel resonance circuit reduces the number of constituent components of the circuit, simplifies the circuit configuration of the high-frequency module 10, and reduces the size thereof.

Figure 3:
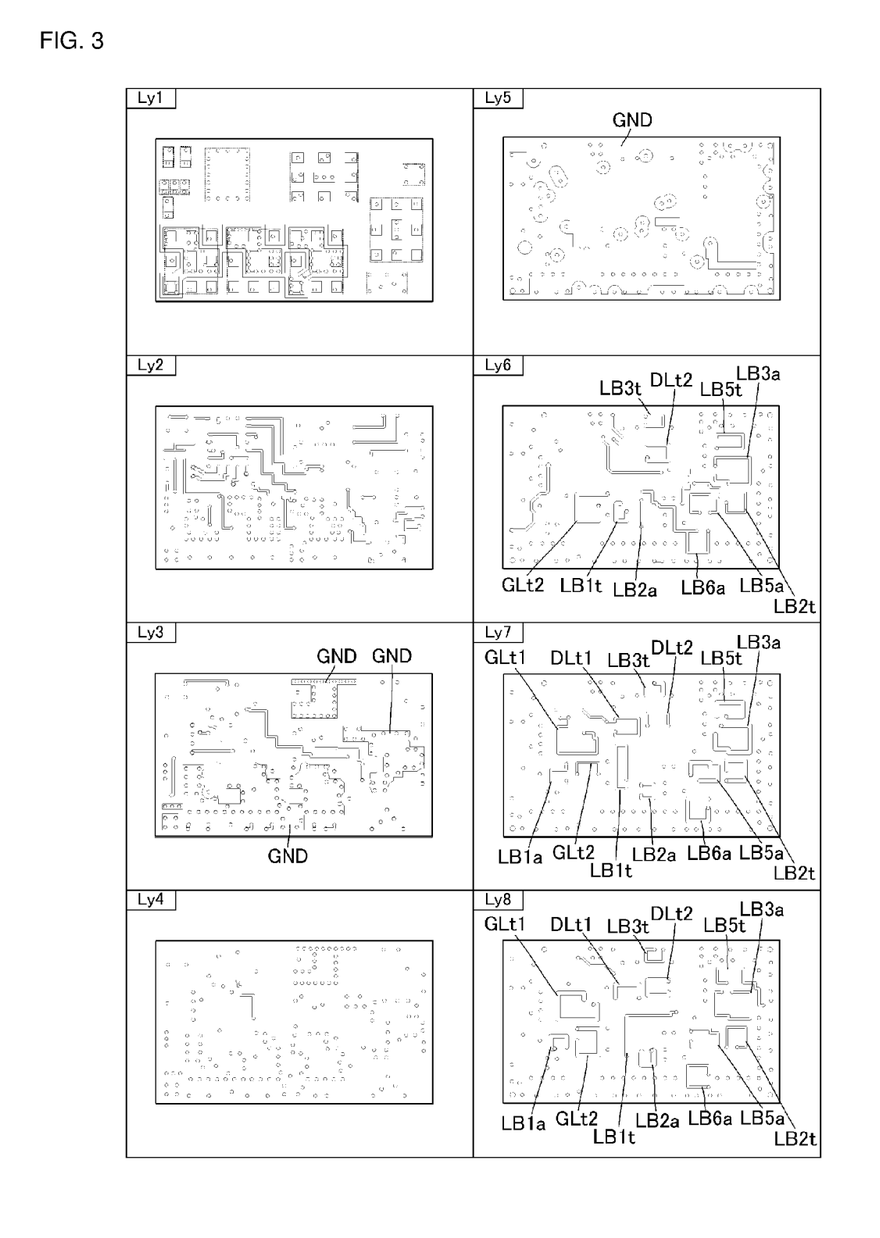
FIG. 3 is a lamination view of a first layer to an eighth layer of the high-frequency module in the first preferred embodiment of the present invention.
Figure 4:
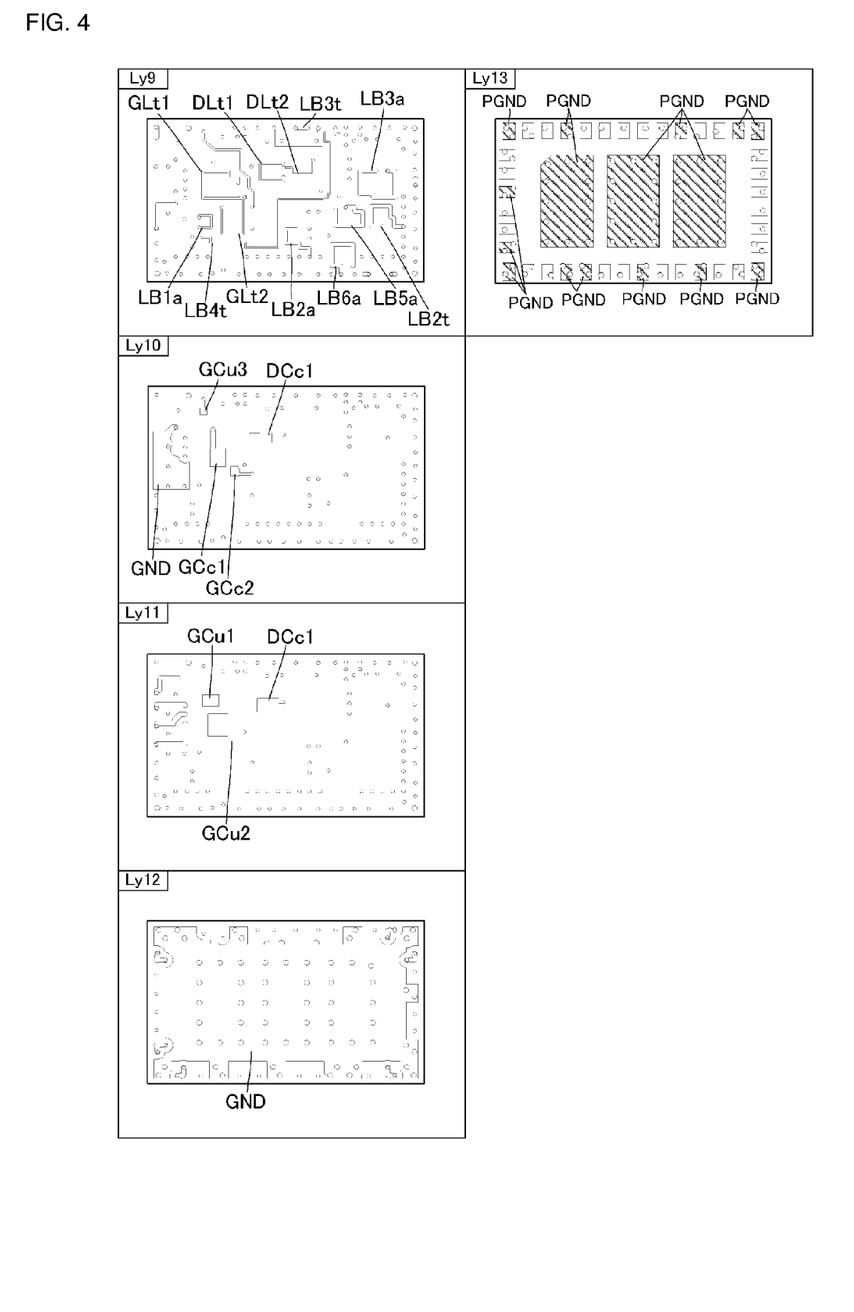
FIG. 4 is a lamination view of a ninth layer to a thirteenth layer of the high-frequency module in the first preferred embodiment of the present invention.
Figure 5:
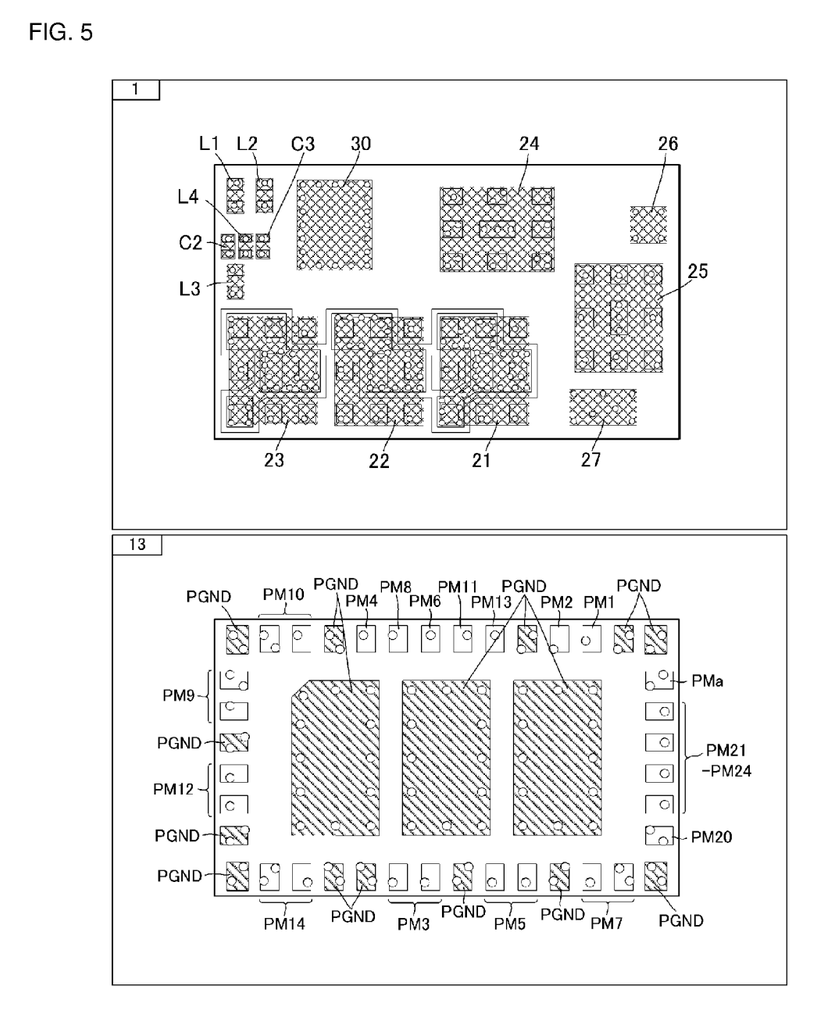
FIG. 5 is an enlarged view of the first layer (uppermost layer) and the thirteenth layer (lowermost layer) of the high-frequency module in the first preferred embodiment of the present invention.

The high-frequency module 10 having the above-mentioned circuit configuration is realized by the following structure. FIG. 3 is a lamination view of a first layer to an eighth layer of the high-frequency module in the first preferred embodiment of the present invention. FIG. 4 is a lamination view of a ninth layer to a thirteenth layer of the high-frequency module in the first preferred embodiment of the present invention. FIG. 5 is an enlarged view of the first layer (uppermost layer) and the thirteenth layer (lowermost layer) of the high-frequency module in the first preferred embodiment of the present invention. It should be noted that conductor patterns are provided on the first layer to the twelfth layer at each surface side thereof and a conductor pattern is provided on the thirteenth layer at the rear surface side thereof.

The high-frequency module 10 includes a multilayer body preferably formed by laminating the plurality of dielectric layers (thirteen layers in the preferred embodiment) and mounting circuit components mounted on the surface of the multilayer body. The multilayer body preferably has a rectangular or substantially rectangular parallelepiped shape and is called a multilayer substrate. The conductor patterns are provided on the individual layers of the multilayer body and a plurality of via conductors (small circles in FIG. 3, FIG. 4, and FIG. 5) penetrating through the dielectric layers are formed in the multilayer body. The conductor patterns, the via conductors, and the mounting circuit components define the circuits as illustrated in FIG. 1. It should be noted that detailed description of the via conductors will be omitted below.

As illustrated in FIG. 3, component mounting land conductors are provided on the first layer, that is, the surface layer of the multilayer body. As illustrated in FIG. 5, the mounting circuit components are mounted on respective component mounting lands. The mounting circuit components are the inductors L1, L2, L3, and L4 that are chip inductors, the capacitors C2 and C3 that are chip capacitors, the SAW duplexers 21, 22, 23, 24, and 25 including piezoelectric resonant elements, and the SAW filters 26 and 27 including the piezoelectric resonators.

The inductors L1, L2, L3, and L4 and the capacitors C2 and C3 are concentrated in the vicinity of a first corner portion when the mounting surface of the multilayer body is seen from the above. The switch IC 30 is arranged in a region that is located in the vicinity of a first side forming the first corner portion and also located on the side closer to the first corner portion when the multilayer body is seen from the above. The SAW duplexers 21, 22, and 23 are arranged in the vicinity of a second side opposing the first side along the stated second side. The SAW duplexer 24 is arranged in a region that is located in the vicinity of the first side and also located on the side farther from the first corner portion. The SAW duplexer 25 and the SAW filters 26 and 27 are arranged in the vicinity of a fourth side opposing a third side forming the first corner portion along the stated fourth side.

A routing conductor pattern that defines the circuit configuration of FIG. 1 is provided on the second layer of the multilayer body.

A routing conductor pattern that defines the circuit configuration of FIG. 1 and a plurality of internal ground conductor patterns GND are provided on the third layer of the multilayer body. The internal ground conductor patterns GND on the third layer are arranged such that at least a portion of them overlap with the mounting regions of the SAW duplexers 21 to 25.

A routing conductor pattern that defines the circuit configuration of FIG. 1 is provided on the fourth layer of the multilayer body.

An internal ground conductor pattern GND is provided on the fifth layer of the multilayer body. The internal ground conductor pattern GND on the fifth layer preferably has a shape extending over a substantially overall surface of the fifth layer.

Linear conductor patterns that define the inductors GLt2, DLt2, LB2a, LB3a, LB5a, LB6a, LB1t, LB2t, LB3t, and LB5t are provided on the sixth layer of the multilayer body.

Linear conductor patterns that define the inductors GLt1, GLt2, DLt1, DLt2, LB1a, LB2a, LB3a, LB5a, LB6a, LB1t, LB2t, LB3t, and LB5t are provided on the seventh layer and the eighth layer of the multilayer body.

Linear conductor patterns that define the inductors GLt1, GLt2, DLt1, DLt2, LB1a, LB2a, LB3a, LB5a, LB6a, LB2t, LB3t, and LB4t are provided on the ninth layer of the multilayer body.

With the conductor patterns on the sixth layer to the ninth layer of the multilayer body, the inductors GLt1, GLt2, DLt1, DLt2, LB1a, LB2a, LB3a, LB5a, LB6a, LB1t, LB2t, LB3t, LB4t, and LB5t are provided in the multilayer body. In this case, each inductor is realized by a spirally coiled conductor the axial direction of which is the lamination direction.

Planer conductor patterns defining the capacitors GCc1, GCc2, GCu3, and DCc1 are provided on the tenth layer of the multilayer body. In addition, an internal ground conductor pattern GND is provided on the tenth layer of the multilayer body.

Planer conductor patterns that define the capacitors GCu1, GCu2, and DCc1 are provided on the eleventh layer of the multilayer body. In addition, routing conductor patterns that define the circuit configuration of FIG. 1 are provided in the vicinity of the third side on the eleventh layer of the multilayer body.

An internal ground conductor pattern GND is provided on the twelfth layer of the multilayer body. The internal ground conductor pattern GND on the twelfth layer has a shape extending over a substantially overall surface of the twelfth layer.

External connection lands of various types and external ground lands PGND are provided on the thirteenth layer as the lowermost layer (bottom surface) of the multilayer body. Three external ground lands PGND are aligned in a center region of the rear surface of the multilayer body and also have areas larger than those of the other external ground lands PGND and the external connection lands of various types. The external connection lands of various types are rectangular or substantially rectangular conductor patterns that define the antenna connection terminal PMa, the front-end connection terminals PM1, PM2, PM3, PM4, PM5, PM6, PM7, PM8, PM9, PM10, PM11, PM12, PM13, and PM14, and the control terminals PM20, PM21, PM22, PM23, and PM24 as illustrated in FIG. 1.

As illustrated in FIG. 5, the external ground lands PGND are arranged on the corner portions. The external ground lands PGND, the external connection land for the front-end connection terminal PM1, the external connection land for the front-end connection terminal PM2, the external ground land PGND, the external connection land for the front-end connection terminal PM13, the external connection land for the front-end connection terminal PM11, the external connection land for the front-end connection terminal PM6, the external connection land for the front-end connection terminal PM8, the external connection land for the front-end connection terminal PM4, the external ground land PGND, the external connection lands for the front-end connection terminal PM10, and the external ground land PGND are aligned in this order from a corner portion opposite to the first corner portion side of the first side.

The external ground land PGND, the external connection lands for the front-end connection terminal PM9, the external ground land PGND, the external connection lands for the front-end connection terminal PM12, and the external ground lands PGND are aligned in this order from the first-side side of the third side.

The external ground land PGND, the external connection lands for the front-end connection terminal PM14, the external ground lands PGND, the external connection lands for the front-end connection terminal PM3, the external ground land PGND, the external connection lands for the front-end connection terminal PM5, the external ground land PGND, the external connection lands for the front-end connection terminal PM7, and the external ground land PGND are aligned in this order from the second-side side of the third side.

The external ground land PGND, the external connection land for the control terminal PM20, and the external connection lands for forming the control terminals PM21, PM22, PM23, and PM24 are aligned in this order from the second-side side of the fourth side.

With this structure, the inductor LB1a defining the phase circuit 42 is provided in the multilayer body and the inductor L3 defining the phase circuit 43 is mounted on the surface of the multilayer body. This prevents the approach of the inductor LB1a and the inductor L3 to be close to each other, thus suppressing or preventing coupling (magnetic field coupling) between the inductor LB1a and the inductor L3. Accordingly, the level of isolation between the circuit of the SAW duplexer 22 side and the circuit of the SAW duplexer 23 is ensured to be high.

It is preferable that the internal ground conductor pattern to which the inductor LB1a is connected and the internal ground conductor pattern to which the inductor L3 is connected be different from each other. To be specific, it is preferable that the internal ground conductor pattern to which the inductor LB1a is connected and the internal ground conductor pattern to which the inductor L3 is connected be electrically insulated from each other in the multilayer body. With this, leakage of a signal including harmonic waves, flowing through the internal ground conductor pattern which is connected to the inductor LB1a, to the inductor L3 while passing through the internal ground conductor pattern which is connected to the inductor L3 is significantly reduced or prevented. Accordingly, leakage of the high-frequency signal while passing through the internal ground conductor patterns can be is suppressed or prevented and the level of isolation between the circuit of the SAW duplexer 22 side and the circuit of the SAW duplexer 23 is able to be ensured to be higher.

In the present preferred embodiment, the inductors LB1a and L3 of the phase circuits 42 and 43 that are connected to the same selection target terminal P4 preferably are a built-in type and a mounting type, respectively. However, both the inductors LB1a and L3 may be of a built-in type. In this case, it is preferable for the formation positions of the inductors LB1a and L3 to be distanced from each other. For example, it is preferable that the inductor L1Ba be provided in a region overlapping with the mounting region of the SAW duplexer 22 to which the phase circuit 42 is connected and the inductor L3 be provided in a region overlapping with the mounting region of the SAW duplexer 23 to which the phase circuit 43 is connected when the multilayer body is seen from the above. In this case, it is more preferable that a via conductor which is connected to the ground be provided between the inductor L1Ba and the inductor L3.

Alternatively, both the inductors LB1a and L3 may be of a mounting type. In this case, it is preferable that the mounting positions of the inductors LB1a and L3 be distanced from each other or another mounting circuit component such as a switch IC be mounted between the inductors LB1a and L3.

It is preferable for the mounting positions of the SAW duplexer 22 which is connected to the phase circuit 42 and the SAW duplexer 23 which is connected to the phase circuit 43 to be distanced from each other. This structure prevents leakage of the high-frequency signal between the SAW duplexers 22 and 23 and ensures a higher isolation level between the circuit of the SAW duplexer 22 side and the circuit of the SAW duplexer 23.

In the above-described preferred embodiment, the inductors other than the inductor L1Ba and the capacitors are provided as the mounting circuit components in the phase circuits 42 and 43. However, they can be appropriately provided as the built-in type components. It should be noted that usage of a large number of mounting circuit components makes it possible to easily adjust the characteristics of the phase circuits 42 and 43 only by replacing the mounting circuit components.

Figure 6:
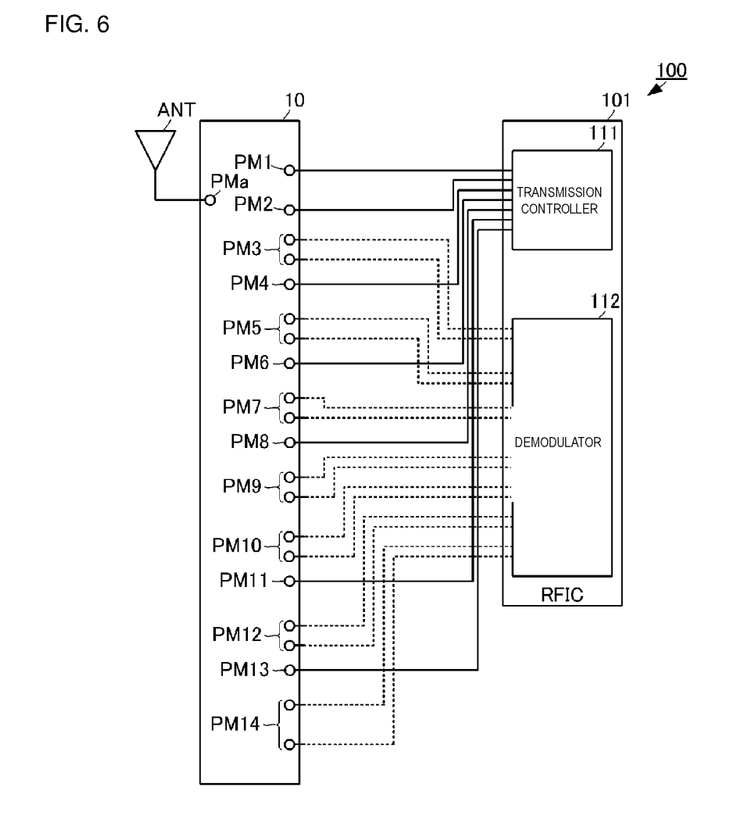
FIG. 6 is a circuit block diagram of a communication device according to a preferred embodiment of the present invention.

The high-frequency module having the above-discussed structure can be used in a communication device described below. FIG. 6 is a circuit block diagram of the communication device according to a preferred embodiment of the present invention.

As illustrated in FIG. 6, the communication device 100 includes the high-frequency module 10, an antenna ANT, and an RFIC 101. The high-frequency module 10 has the above-mentioned structure. The antenna ANT is connected to the antenna connection terminal PMa of the high-frequency module 10. The front-end connection terminals PM1, PM2, PM4, PM6, PM8, PM11, PM12, and PM13 of the high-frequency module 10 are connected to a transmission controller 111 of the RFIC 101. The front-end connection terminals PM3, PM5, PM7, PM9, PM10, PM12, and PM14 of the high-frequency module 10 are connected to a demodulator 112 of the RFIC 101.

It should be noted that the control terminals PM20, PM21, PM22, PM23, and PM24 of the high-frequency module 10 are connected to the RFIC 101 (connection relations thereof are not illustrated) and switching operation of the switch IC 30 of the high-frequency module 10 is controlled by the RFIC 101.

When the above-described carrier aggregation in which the transmission of the first transmission signal f1Tx and the reception of the second reception signal f2Rx are performed simultaneously is executed, the RFIC 101 causes the transmission controller 111 and the demodulator 112 to operate simultaneously.

This configuration significantly decreases or prevents a decrease in the reception sensitivity to the second reception signal and demodulates the second reception signal reliably even when the above-described carrier aggregation in which the transmission of the first transmission signal f1Tx and the reception of the second reception signal f2Rx are performed simultaneously is executed.

Although a case in which the carrier aggregation is executed is explained in the above description, the carrier aggregation may not be executed. However, the case in which the carrier aggregation is executed can bring more effective action effects in various preferred embodiments of the present invention.

Although the carrier aggregation in which the transmission of the first transmission signal and the reception of the second reception signal are performed is represented as an example in the above description, the above-described configuration can be also applied to a mode in which the carrier aggregation of the first communication signal and the second communication signal is executed in such a case that the first reception signal is also received simultaneously.

Although a case in which the communication signal of Band 17 and the communication signal of Band 4 are used is represented in the above description, the above-described configuration can be applied, so as to obtain the same action effects, to a case in which the harmonic frequency of the transmission signal of one communication signal overlaps with or is close to the fundamental frequency of the reception signal of the other communication signal.

Although a mode in which the high-frequency module 10 includes the switch IC 30 is represented in the above description, the above-described action effects can be obtained as long as at least the circuits between the selection target terminal PS4 and the front-end connection terminals PM5, PM6, PM7, and PM8 are included.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A high-frequency module comprising:
a first transmission/reception circuit that transmits and receives a first communication signal of a first frequency band;
a second transmission/reception circuit that transmits and receives a second communication signal of a second frequency band different from the first frequency band;
a common terminal that is to be connected to an antenna which is commonly used for the first communication signal and the second communication signal;

a connection point that is a single point at which the first transmission/reception circuit, the second transmission/reception circuit, and the common terminal are connected; and a phase circuit, independent of an antenna switch, that includes a circuit element which is connected to the connection point and the first transmission/reception circuit and performs phase adjustment so as to make the second transmission/reception circuit side, when seen from the connection point, be in an open state at a high frequency in the first frequency band and make the first transmission/reception circuit side, when seen from the connection point, be in an open state at a high frequency in the second frequency band; wherein the phase circuit includes a band elimination filter connected between the connection point and the first transmission/reception circuit; and the band elimination filter has an attenuation band including a harmonic frequency of a specific frequency band in the first frequency band and pass bands provided at a high frequency side and a low frequency side on outer side portions of the attenuation band, and includes the first frequency band in the pass band at the low frequency side.

2. The high-frequency module according to claim 1, wherein
frequency bands of the attenuation band and the second frequency band overlap with each other;
the first transmission/reception circuit includes a duplexer circuit which separates a transmission signal and a reception signal of the first communication signal; and
the second transmission/reception circuit includes a duplexer circuit which separates a transmission signal and a reception signal of the second communication signal.

3. The high-frequency module according to claim 1, wherein the phase circuit includes a parallel resonance circuit including:
a first inductor which is connected in series between the connection point and the first transmission/reception circuit; and
a first capacitor which is connected in parallel with the first inductor.

4. The high-frequency module according to claim 3, wherein the phase circuit includes a second inductor which is connected between the parallel resonance circuit at the first transmission/reception circuit side and ground.

5. The high-frequency module according to claim 4, wherein the phase circuit further includes:
a second capacitor which is connected in series between the connection point and the second transmission/reception circuit; and
a third inductor which is connected between the second capacitor at the second transmission/reception circuit side and the ground.

6. The high-frequency module according to claim 5, further comprising a multilayer body including a plurality of dielectric layers on which conductor patterns are provided; wherein
one of the second inductor and the third inductor is a coiled conductor defined by the conductor patterns in the multilayer body; and
the other one of the second inductor and the third inductor is a surface mount inductor component mounted on a surface of the multilayer body.

7. The high-frequency module according to claim 6, wherein
the multilayer body includes a plurality of ground conductors; and
a ground conductor to which the second inductor is connected is different from a ground conductor to which the third inductor is connected.

8. The high-frequency module according to claim 6, further comprising a switch circuit which includes an antenna connection terminal and a plurality of selection target terminals, and selects one of the plurality of selection target terminals and connects the selected selection target terminal to the antenna connection terminal; wherein
the switch circuit includes a diode-type switch element which is mounted on the surface of the multilayer body.

9. The high-frequency module according to claim 5, further comprising a multilayer body including a plurality of dielectric layers on which conductor patterns are provided; wherein
the second inductor and the third inductor are coiled conductors defined by the conductor patterns in the multilayer body;
a first circuit element of the first transmission/reception circuit and a second circuit element of the second transmission/reception circuit are mounted on a surface of the multilayer body;
the coiled conductor of the second inductor is arranged under a mounting region of the first circuit element; and
the coiled conductor of the third inductor is arranged under a mounting region of the second circuit element.

10. The high-frequency module according to claim 9, wherein the first circuit element and the second circuit element include duplexers including piezoelectric resonators.

11. The high-frequency module according to claim 1, further comprising a switch circuit which includes an antenna connection terminal and a plurality of selection target terminals, and selects one of the plurality of selection target terminals and connects the selected selection target terminal to the antenna connection terminal; wherein
the common terminal is one of the plurality of selection target terminals.

12. The high-frequency module according to claim 1, wherein the first communication signal and the second communication signal are transmitted/received by any one of simultaneous transmission in which the two communication signals are transmitted simultaneously, simultaneous reception in which the two communication signals are received simultaneously, and simultaneous transmission and reception in which one of the communication signals is transmitted and the other of the communication signals is received simultaneously.

13. A communication device comprising:
the high-frequency module according to claim 1;
an antenna that is connected to the high-frequency module and is common to the first communication signal and the second communication signal; and
an RFIC that is connected to the high-frequency module and controls transmission/reception of the first communication signal and the second communication signal while selecting any one of simultaneous transmission in which the two communication signals are transmitted simultaneously, simultaneous reception in which the two communication signals are received simultaneously, and simultaneous transmission and reception in which one of the communication signals is transmitted and the other of the communication signals is received simultaneously.

14. The communication device according to claim 13, wherein frequency bands of the attenuation band and the second frequency band overlap with each other.

15. The communication device according to claim 13, wherein
the first transmission/reception circuit includes a duplexer circuit which separates a transmission signal and a reception signal of the first communication signal; and
the second transmission/reception circuit includes a duplexer circuit which separates a transmission signal and a reception signal of the second communication signal.

16. The communication device according to claim 13, wherein the phase circuit includes a parallel resonance circuit including:
a first inductor which is connected in series between the connection point and the first transmission/reception circuit; and
a first capacitor which is connected in parallel with the first inductor.

17. The communication device according to claim 16, wherein the phase circuit includes a second inductor which is connected between the parallel resonance circuit at the first transmission/reception circuit side and ground.

18. The communication device according to claim 17, wherein the phase circuit further includes:
a second capacitor which is connected in series between the connection point and the second transmission/reception circuit; and
a third inductor which is connected between the second capacitor at the second transmission/reception circuit side and the ground.

19. The communication device according to claim 18, further comprising a multilayer body including a plurality of dielectric layers on which conductor patterns are provided; wherein one of the second inductor and the third inductor is a coiled conductor defined by the conductor patterns in the multilayer body; and
the other one of the second inductor and the third inductor is a surface mount inductor component mounted on a surface of the multilayer body.

20. A high-frequency module comprising:
a first transmission/reception circuit that transmits and receives a first communication signal of a first frequency band;
a second transmission/reception circuit that transmits and receives a second communication signal of a second frequency band different from the first frequency band;
a switch circuit that includes an antenna connection terminal and a plurality of terminals to be selected;
a connection point at which the first transmission/reception circuit, the second transmission/reception circuit, and one of the plurality of terminals of the switch circuit are connected; and
a phase circuit, independent of the switch circuit, that includes a circuit element which is connected to the connection point and the first transmission/reception circuit and performs phase adjustment so as to make the second transmission/reception circuit side, when seen from the connection point, be in an open state at a high frequency in the first frequency band and make the first transmission/reception circuit side, when seen from the connection point, be in an open state at a high frequency in the second frequency band; wherein
the phase circuit includes a band elimination filter connected between the connection point and the first transmission/reception circuit; and
the band elimination filter has an attenuation band including a harmonic frequency of a specific frequency band in the first frequency band and pass bands provided at a high frequency side and a low frequency side on outer side portions of the attenuation band, and includes the first frequency band in the pass band at the low frequency side.

* * * * *